United States Patent [19]  [11] 4,084,312
Kirk et al.  [45] Apr. 18, 1978

[54] ELECTRICALLY ISOLATED HEAT SINK LEAD FRAME FOR PLASTIC ENCAPSULATED SEMICONDUCTOR ASSEMBLIES

[75] Inventors: Glenn E. Kirk, Mesa; Alfred L. Medesha, Apache Junction, both of Ariz.

[73] Assignee: Motorola, Inc., Schaumburg, Ill.

[21] Appl. No.: 647,234

[22] Filed: Jan. 7, 1976

[51] Int. Cl.² ............... H01L 23/28; H01L 23/48
[52] U.S. Cl. .................... 29/588; 174/52 FP; 357/70
[58] Field of Search ........... 174/52 FP; 357/70; 29/193.5, 588, 589, 627, 630 G

[56] References Cited
U.S. PATENT DOCUMENTS

| 3,431,092 | 3/1969 | Lehner | 29/193.5 |
| 3,606,673 | 9/1971 | Overman | 29/588 |
| 3,660,669 | 5/1972 | Grenon | 357/70 X |
| 3,763,403 | 10/1973 | Lootens | 174/52 PE |
| 3,922,712 | 11/1975 | Stryker | 357/70 X |

Primary Examiner—Bruce A. Reynolds
Assistant Examiner—D. A. Tone
Attorney, Agent, or Firm—John A. Fisher

[57] ABSTRACT

An improved lead frame having an electrically isolated heat sink portion is provided for the manufacture of high heat dissipating semiconductor devices. A large heat sink metallic portion having an exposed surface has plastic encapsulating material partially disposed thereabout such that associated semiconductor device leads are correctly positioned with respect to the heat sink metallic portion but are electrically isolated from it. A semiconductor chip is mounted directly on the heat sink metallic portion such that high heat dissipation is obtained. The lead frame provides for a plurality of metallic heat sink portions joined to a corresponding plurality of semiconductor device lead portions. Joining means positioned in the frame between adjacent metallic heat sink portions and correspondingly between successive semiconductor device lead portions are attached to each other to hold the respective portions of the lead frame in proper relationship to each other during the assembly process. These joining means are removed after plastic encapsulation thereby making it possible to electrically isolate the metallic heat sink portion from the semiconductor device lead portion. The use of this type composite lead frame structure where the metallic heat sink portion is joined to the device lead frame structure allows great versatility in types of material and types of fabrication steps used to provide a semiconductor device while the particular joining means used make it possible to obtain these advantages while still maintaining an electrically isolated heat sink.

6 Claims, 4 Drawing Figures

ELECTRICALLY ISOLATED HEAT SINK LEAD FRAME FOR PLASTIC ENCAPSULATED SEMICONDUCTOR ASSEMBLIES

RELATED APPLICATIONS

This application is related to assignee's copending patent application Ser. No. 616,456 by Lehner et al filed Sept. 24, 1975.

BACKGROUND OF THE INVENTION

This invention relates to lead frames for the manufacture of semiconductor devices encapsulated in a plastic material and more particularly to lead frame structures which are adapted to providing semiconductor devices having an electrically isolated heat sink while still using a multiple unit preassembly structure which is amenable to reduced cost automated manufacturing techniques.

The development of more highly automated techniques for the manufacture of semiconductor devices has resulted in the development of various types of lead frames by which the relatively small and fragile metallic device leads ultimately associated with a semiconductor device are initially formed as a multiple unit preassembly structure which is arranged to maintain mechanical rigidity by use of tie bars and which is adapted for automatic assembly techniques with indexing holes. These multiple unit lead frames allow automatically indexed sequential operations and batch handling and result in greatly reduced manufacturing costs. Initially these lead frame approaches were proposed for low power transistor structures which were relatively small as in Helda et al, U.S. Pat. No. 3,444,441. Later developments expanded these techniques to physically larger transistor structures having much higher power dissipation requirements as in Seigerson, U.S. Pat. No. 3,574,815. When semiconductor structures having higher power dissipation requirements are manufactured, an additional constraint is introduced in that the portion of the lead frame structure used to provide physical support for the semiconductor device must now be adapted to not only physically hold the semiconductor device but to effectively conduct heat away from this semiconductor device. This thermal conduction avoids the buildup of high temperatures within the semiconductor device junctions which tend to destroy the device or reduce its long term reliability. In many applications, it is a further requirement that the semiconductor device include a heat sink metallic portion for mounting the semiconductor chip which is electrically isolated from the leads of the semiconductor device. Also, the recent development of high power dissipation integrated circuits such as drivers, regulators and power amplifiers have resulted in a requirement for low cost plastic packages with more than three device leads which have a high power dissipation capability.

SUMMARY OF THE INVENTION

Accordingly, it is an object of this invention to provide an improved semiconductor device lead frame for the manufacture of high power dissipation semiconductor devices in which the semiconductor device leads are electrically isolated from the metallic heat sink portion of the semiconductor device.

It is a further object of this invention to provide an improved semiconductor device lead frame in which a plurality of heat sink portions forming a multiple unit preassembly structure are joined to a plurality of device lead arrangements formed as a second multiple unit preassembly structure by joining means which are separate from the heat sink portions and device lead arrangements thereby providing a composite lead frame structure in which semiconductor device leads are electrically isolated from the corresponding metallic heat sink portion.

It is a further object of this invention to provide an improved semiconductor device lead frame adapted for the manufacture of high power dissipation semiconductor devices having more than three device leads.

Briefly described, the present invention is an improved semiconductor lead frame in which a multiple unit heat sink preassembly structure is joined to a multiple unit device lead preassembly structure by joining means disposed between the respective multiple units to form a composite device lead frame in which the semiconductor device leads are electrically isolated from their corresponding metallic heat sink.

DETAILED DESCRIPTION OF THE INVENTION

The invention is embodied in a semiconductor device lead frame primarily used in the manufacture of semiconductor devices which are used as power units requiring substantial dissipation of internally generated heat. The semiconductor device is comprised of a plurality of adjacent but physically separated metallic members lying in substantially a single plane. The metallic members are arranged to be electrically isolated from each other and form a mounting portion positioned adjacent to the ends of the members and displaced from the plane of the members. The mounting portion has a first and a second surface and includes an opening extending thereto. A semiconductor die, which may be an integrated circuit, is positioned on the mounting portion at the first surface and is connected electrically to the metallic members by wires. The plastic encapsulation is disposed about the die, the connecting wires and the immediately adjacent parts of the metallic members. This plastic encapsulation provides the structural link by which the metallic members are positioned adjacent to the mounting portion but are electrically isolated from the mounting portion. The encapsulation is formed so that a region of both the first and the second surface of the mounting portion is exposed. A hole in the mounting portion adapts the semiconductor device for receiving a bolt or other fastening to mount the device on a metal surface in electrical equipment.

Figure 1:
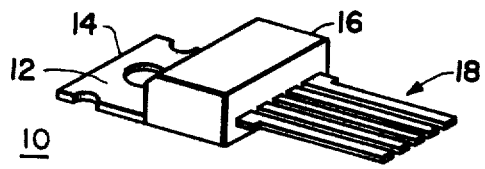
FIG. 1 is an enlarged isometric view of a semiconductor device fabricated using the semiconductor device lead frame of the present invention.

FIG. 1 shows an isometric view of a semiconductor device 10 viewed such that the exposed part of the first surface 12 of the mounting portion 14 is visible. The remaining portion of the mounting surface is surrounded by plastic housing 16 which forms the encapsulation for the device. A semiconductor die (not visible in this view) is mounted directly on the upper surface 12 of the mounting portion 14 so that there is good heat transfer between the two although the die may be electrically insulated therefrom. When assembled in electrical equipment, one or the other of the surfaces of the mounting portion is generally coupled with a large heat sink to provide for the rapid and efficient removal of heat generated internally during the operation of the semiconductor device. Also visible in FIG. 1 are metallic members 18 which form the leads of the semiconductor device. The particular embodiment of device 10 has five leads.

Although device 10 has five leads, the invention is not to be construed as being limited to this number as it is evident that the number of leads may be readily increased or decreased. All these leads are fabricated from a metal havng a very low electrical resistance and a very high thermal conductivity and preferably comprise a base metal of copper plated with nickel, silver or gold for corrosion resistance and for facilitating the assembly operation.

The plastic housing 16 is preferably a low-shrinkage, filled plastic material suitable for transfer molding. In choosing a plastic, its compatability with the components of the device and the stability of the device encapsulated therein when aged and subject to a wide variation in environmental conditions are two considerations of prime importance. A plastic suitable for transfer molding is preferred because the resulting housing or encapsulation is uniform, void free, and tightly sealed about the elements of the device. Epoxy and silicon plastics, with or without fillers, are preferred, although many other well known plastics of similar properties may be utilized.

In transfer molding the plastic encapsulation for semiconductor devices, heat and pressure are applied to convert the plastic, which is normally in a solid state, into a very low viscosity liquid which is then rapidly transferred from one mold chamber to another normally comprising the final package shape. Because of this low viscosity in the nature of the transfer molding, high pressures may be utilized without damaging the delicate parts associated with semiconductor devices. With the uniform mass formed by transfer molding the plastic encapsulation, the elements of device 10 are held in a rigid fixed relationship and generally are not subject to damage by vibrations and shocks. The bottom surface of mounting portion 14 (not shown in FIG. 1) is flush with the bottom surface of plastic housing 16 so that when mounted on a chassis or other structure, contact is maintained therebetween. This provides a large transferring surface for dissipating heat vertically and laterally from the semiconductor die mounted on the first surface 12 of mounting portion 14 within the plastic encapsulation. The resulting effect is as if the die were mounted directly on the large heat sink giving nearly ideal transferring properties.

Figure 2:
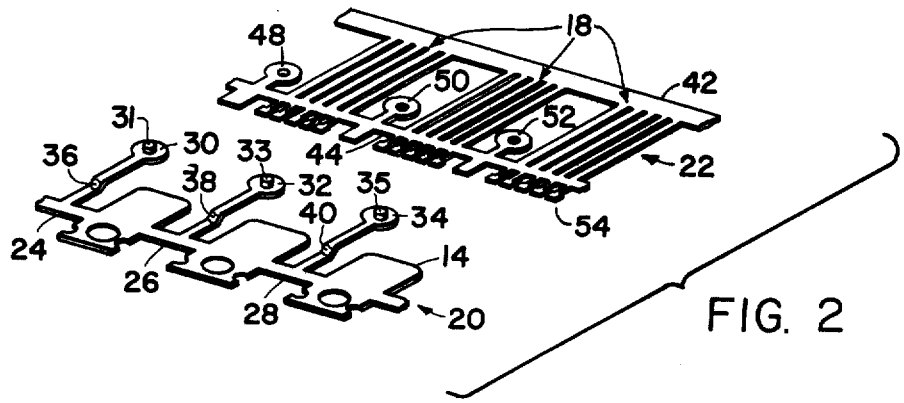
FIG. 2 is an exploded isometric view of the preassembly structures which are joined to form the semiconductor device lead frame of the present invention.

Turning now to FIG. 2, there is shown an exploded isometric view of the preassembly structures which are joined to form the semiconductor device lead frame according to the present invention. These preassembly structures comprise a first preassembly structure 20 and a second preassembly structure 22. Preassembly structure 20 has been punched to form a plurality of interconnecting groups of the metallic heat sinks or mounting portions 14 joined together by tie bar segments 24, 26 and 28. Joining means 30, 32 and 34 connected to these tie bar segments provide the mechanism by which preassembly structure 20 will join to preassembly structure 22 to form a composite lead frame as described below. Each of the joining means 30, 32 and 34 are fabricated to include an offset bend at locations 36, 38 and 40 to provide for proper positioning of preassembly structure 22 above mounting surface 12 of the heat sink 14 when the preassembly structures are ultimately joined.

In analogous fashion, preassembly structure 22 is punched etched or otherwise worked to form a plurality of interconnected groups of individual metallic members 18. The interconnection of these groups is provided by tie bar 42 and by tie bar 44. Tie bar 44 also serves to position joining means 48, 50 and 52 in a location between the groups of individual metallic members 18. The end of each of the joining means 48, 50 and 52 is widened and provided with a hole to receive an extruded post 31, 33 and 35 of the heat sink preassembly structure 20 in the subsequent joining operation. As shown, in FIG. 2, tie bar 44 holds the individual metallic members 18 of each group in rigid alignment during all assembly steps. The ends of each group of metallic members 18 are formed as at 54 to adapt the ends of these metallic members for the connection to wires in subsequent assembly steps.

In applications for semiconductor devices having higher power dissipation, the structure of the mounting portion must be adapted to provide a maximum heat dissipation capability. Typically, this additional capability is provided by increasing the thickness of the mounting portion and by changing the material used to form the mounting portion to obtain a structure with improved heat dissipation and mechanical characteristics. The application of these additional constraints on the mounting portion would create difficulties if it were required that the individual metallic members forming device leads and the associated mounting portion were to be punched or formed from a single piece of material since the increased thickness required for proper thermal and mechanical characteristics of the mounting portion is inappropriate for device lead structures. Further, the selection of materials with appropriate thermal dissipation characteristics for the mounting portion may be incompatible with the material selection required for a good mechanical characteristics of the semiconductor device leads. In contrast, the composite structure of the present invention allows each of the requirements of the mounting portion and of the semiconductor device lead portions be optimized in terms of the type of structure and type of material used. A further advantage to the composite structure is that the individual component parts of the component structure can now be manufactured using fabrication procedures which are optimized to their particular requirements. Thus, for example, associated manufacturing steps such as plating can be performed and associated methods optimized for the particular component part for the final composite structure.

Figure 3:
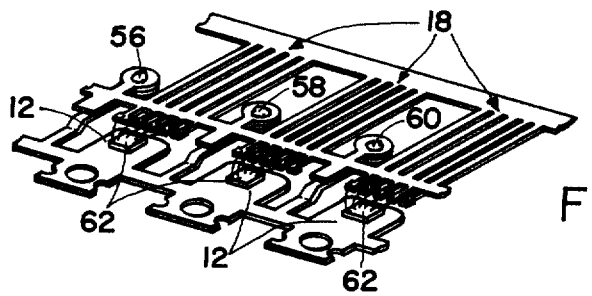
FIG. 3 is an isometric view of the composite semiconductor device lead frame of the present invention with semiconductor devices affixed to mounting portions and joined by fine wires to integral lead portions of the semiconductor device lead frame.

FIG. 3 shows an isometric view of the composite semiconductor lead frame which results from the joining of first preassembly structure 20 and second preassembly structure 22. For this particular embodiment, the composite lead frame is formed by mounting the extruded posts 31, 33 and 35 (FIG. 2) of first joining means 30, 32 and 34 into the corresponding holes in second joining means 48, 50 and 52 (FIG. 2). After inserting, the ends of the extruded posts are riveted as shown at locations 56, 58 and 60 such that the two preassembly structures are rigidly joined together. The offset bands previously described for joining means 30, 32 and 34 insure that the ends 54 of the individual metallic members 18 are properly positioned with respect to mounting surface 12. FIG. 3 also shows semiconductor die 62 mounted to mounting surface 12 and wire bonded using conventional semiconductor assembly procedures such that the composite structure of FIG. 3 comprises a plurality of partially fabricated semiconductor devices ready for plastic encapsulation.

Figure 4:
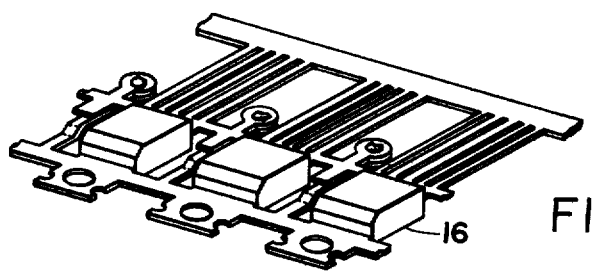
FIG. 4 is an isometric view of the semiconductor device lead frame of FIG. 2 after a plastic encapsulation has been disposed about the semiconductor device, the fine wires and the adjacent metallic portion of each device group such that the lead frame is ready to be sheared to produce individual devices as shown in FIG. 1.

FIG. 4 shows the semiconductor device lead frame according to the present invention after plastic encapsulation. As previously described, this plastic encapsulation is typically accomplished via transfer molding and the number of semiconductor devices formed in a strip is usually selected so that the entire strip may be positioned in a transfer mold as a single unit and the mold closed thereabout to form individual mold cavities about each group of metallic members. The positioning of a group of metallic members within an individual mold cavity provides clamping action across the upper and lower (top and bottom) surfaces of mounting portion 14 and across the upper and lower surfaces of lead frame portion 22 in the vicinity of tie bar 44 with tie bar 44 serving as a mold stop. With the mold closed and clamped, a fluid plastic material is transferred into the cavities to form individually encapsulated devices. The plastic solidifies and cures rapidly and a dense solid plastic encapsulant securely and tightly sealed about the protruding metallic members is formed as shown in FIG. 4. A strip of interconnected completed devices has now been formed on the composite semiconductor device lead frame with plastic encapsulation material 16 surrounding the inner part of mounting portion 14 including the ends 54 of the individual metallic members 18 which will form the individual leads of the completed semiconductor device. As the plastic material shrinks during the curing cycle it is drawn into compression partly locking the solid plastic material in place around the inner part of mounting portion 14 and the ends of metallic members 18 to form a mechanically strong plastic package. The semiconductor device lead frame of FIG. 4 is next transported to a metal shear where the cutting operation separates the plastic encapsulated groups to complete the fabrication of individual semiconductor devices such as device 10 shown in FIG. 1. This shearing operation removes tie bar 42 and the segments of tie bar 44 which form the inner connection between groups of metallic members 18 and the inner connection between each individual metallic member. Thus, the shearing operation removes the first and second joining means. This operation is essential to the present invention since the removal of these joining means results in a completed semiconductor device in which the metallic members forming the semiconductor device leads are electrically isolated from the device heat sink or mounting portion. This electrical isolation feature provides a semiconductor device lead frame of greatly enhanced versatility and usefulness. The electrically isolated mounting portion has the effect of adding an additional semiconductor device lead to the packaged semiconductor device since the encapsulated semiconductor chip can be arranged such that an electrical signal or power supply voltage can be applied to the encapsulated device independent of the electrical signals applied via the other device leads. This feature, coupled with a capability for high power dissipation and the availability of a larger number of semiconductor device leads (five device leads for the particular embodiment shown) make the semiconductor lead frame of the present invention particularly useful in the manufacture of high power dissipation integrated circuits such as drivers, voltage regulators and power amplifiers. The inherent cost advantages of a composite semiconductor device lead frame whose preassembly structures have been cost-optimized and low cost plastic encapsulation coupled with the versatility advantages of a high power dissipation multipin semiconductor package with an electrically isolated heat sink according to the present invention will allow the introduction of a wide variety of high power electronic components at reduced cost.

What is claimed is:

1. A process for the automated manufacture of semiconductor devices characterized by the steps of:
   (a) forming a first preassembly structure comprising a plurality of die mount portions and first joining means interposed between said die mount portions;
   (b) forming a second preassembly structure comprising groups of separated lead members and second joining means interspersed between said groups;
   (c) forming a composite lead frame by joining said first and said second joining means;
   (d) mounting semiconductor die on said die mount portions and wire bonding said die to said lead members;
   (e) plastic encapsulating said semiconductor devices; and
   (f) shearing away said joining means to produce individual semiconductor devices each having a die mount portion which is electrically isolated from its device leads.

2. A semiconductor device lead frame comprising:
   (a) first preassembly structure means including;
      (1) a plurality of die mount portions each having an upper surface;
      (2) first tie bar means coupled to said die mount portions for holding said die mount portions in fixed relationship with each other and for holding said upper surfaces in substantially a first plane;
      (3) first joining means coupled to said first tie bar means, said first joining means interspersed between said die mount portions and said first joining means terminating in a first attachment region; and
   (b) second preassembly structure means including:
      (1) a plurality of groups of separated lead members;
      (2) second tie bar means joining said separated lead members and said groups of separated lead members; and
      (3) second joining means coupled to said second tie bar means, said second joining means interspersed between said groups and said second joining means terminating in a second attachment region;
   (c) wherein said first preassembly structure and said second preassembly structure are held in fixed relationship with respect to each other by joining said first and said second attachment regions.

3. A semiconductor device lead frame as recited in claim 2 wherein said first attachment region of said first preassembly structure is an extruded post and said second attachment region of said second preassembly structure is a flat region including a hole adapted to receive said extruded post such that such joining comprises inserting said extruded post through said hole and riveting to form a rigid structure.

4. A semiconductor device lead frame as recited in claim 3 wherein said first joining means includes an offset bend which positions said first attachment region in a plane above said first plane such that said groups of separated lead members are positioned above said upper surface of said die mount portions after said joining of said first and said second preassembly structures.

5. A semiconductor device lead frame as recited in claim 3 wherein said first joining means and said second joining means are positioned between said die mount portions and between said groups of separated lead members such that said joining means can be sheared away after completion of assembly of the semiconductor device.

6. A semiconductor device lead frame comprising:
   (a) first preassembly structure means including,
       (1) a plurality of die mount portions,
       (2) first tie bar means coupled to said die mount portions for holding said die mount portions in fixed relationship with each other,
       (3) first joining means interspersed between said die mount portions and terminating in first attachment regions,
   (b) second preassembly structure means including:
       (1) a plurality of groups of separated lead members,
       (2) second tie bar means interconnecting said separated lead members and said groups of separated lead members,
       (3) second joining means interspersed between said groups and terminating in second attachment regions,
   (c) wherein said first preassembly structure and said second preassembly structure are held in fixed relationship with respect to each other by joining said first and said second attachment regions.

* * * * *